(12) United States Patent
Abramzon

(10) Patent No.: US 9,397,677 B1
(45) Date of Patent: Jul. 19, 2016

(54) METHOD AND SYSTEM FOR DIGITAL-TO-ANALOG CONVERTER PERFORMANCE MEASUREMENT USING EQUIVALENT-TIME SAMPLER

(71) Applicant: Keysight Technologies, Inc., Minneapolis, MN (US)

(72) Inventor: Valentin Abramzon, Palo Alto, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/930,645

(22) Filed: Nov. 2, 2015

(51) Int. Cl.
*H03M 1/00* (2006.01)
*H03M 1/68* (2006.01)
*H03M 1/10* (2006.01)
*H03M 1/06* (2006.01)

(52) U.S. Cl.
CPC ............ *H03M 1/002* (2013.01); *H03M 1/0614* (2013.01); *H03M 1/1033* (2013.01); *H03M 1/687* (2013.01)

(58) Field of Classification Search
CPC .... H03M 1/002; H03M 1/1033; H03M 1/687
USPC ................... 341/110, 155, 144, 122
See application file for complete search history.

(56) References Cited

U.S. PATENT DOCUMENTS

| | | | | |
|---|---|---|---|---|
| 6,268,818 | B1* | 7/2001 | Xin | H03D 7/00 341/143 |
| 6,492,798 | B2 | 12/2002 | Sunter | |
| 7,355,537 | B2 | 4/2008 | Lin | |
| 7,385,543 | B2 | 6/2008 | Jungerman | |
| 8,928,509 | B2* | 1/2015 | Gorisse | H04B 7/17 341/123 |
| 2015/0236713 | A1* | 8/2015 | Yasuda | H03M 3/322 341/122 |

* cited by examiner

*Primary Examiner* — Peguy Jean Pierre

(57) ABSTRACT

A system and method: provide a digital input signal to a digital-to-analog converter (DAC) which, in response to a DAC clock signal, converts the digital input signal to an analog output signal; generate from the DAC clock signal a sampling clock signal having pulses spaced apart from each other in time by a plurality of DAC clock periods, wherein a timing of at least one of the pulses is offset with respect to the DAC clock signal by a first fraction of a DAC clock period, and a timing of at least an other one of the pulses of the sampling clock signal is offset with respect to the DAC clock signal by a second fraction of the DAC clock period; sample-and-hold the analog output signal in response to the sampling clock signal; and digitize the sampled-and-held analog output signal to output digital values representing the sampled-and-held analog output signal.

22 Claims, 13 Drawing Sheets

_US 9,397,677 B1_

METHOD AND SYSTEM FOR DIGITAL-TO-ANALOG CONVERTER PERFORMANCE MEASUREMENT USING EQUIVALENT-TIME SAMPLER

BACKGROUND

A digital-to-analog converter (DAC) is a common element in many signal processing devices and systems, including for example many modern communication systems.

FIG. 1 illustrates an example of a simple and basic digital-to-analog converter DAC 100. DAC 100 includes a set of input buffers 102, a resistor ladder 104, an operational amplifier 106, and a feedback resistor $R_{FB}$. In operation, DAC 100 receives an N-bit (e.g., N=7) digital input signal 105 and converts digital input signal 105 to an analog output signal 115. Although not shown in FIG. 1, in practice DAC 100 has associated therewith a reconstruction filter (e.g., a low pass filter) which may be included in DAC 100, or a separate external element, and may also have associated clocked input latches for digital input signal 105 to ensure that the bits from the LSB to the MSB transition at the same time. Many other DAC architectures are known, such as current-mode DACs which are typically employed for many high-speed, high-performance, DACs. FIG. 2 illustrates an example piecewise constant output signal of an idealized DAC before (trace 205) and after (trace 215) passing through a reconstruction filter.

To ensure that a DAC is able to meet its required performance characteristics, it is necessary to be able to accurately measure one or more performance characteristics, such as nonlinear distortion. Many modern digital-to-analog converters (DACs), such as DACs used in instrumentation and communications applications, operate at a very high speed with a very high degree of accuracy and high spectral purity. This in turn makes the requirements for measuring its performance more stringent and difficult to achieve.

Furthermore, to attain such high performance, it is sometimes desirable, or even necessary, to perform a calibration operation on the DAC, and to supply some adjustment or correction (e.g., predistortion) to the input signal provided to the DAC, or to one or more operating parameters of the DAC, so that it can meet its performance requirements. Performing calibration usually requires measuring the DAC output with higher accuracy than the target accuracy of the DAC itself. One possible solution is to perform measurements using laboratory equipment, such as an oscilloscope and/or a spectrum analyzer. While this is acceptable for debugging and characterizing a few experimental samples of a DAC (e.g., an integrated circuit including the DAC), requiring such test equipment to measure and calibrate each individual DAC in production would in general be prohibitively expensive. Employing off-chip test equipment for measurement (and possibly calibration) of DAC performance has other limitations in terms of the ability to examine internal DAC signals, undesirable filtering of the signals when routing them off-chip, the need for differential probes, and equipment limitations in terms of accuracy and/or the characteristics which they can easily measure.

As more DAC designs rely on calibration to achieve specified level of performance, some on-chip measurement techniques have been developed to characterize the behavior of DACs, providing information to the DAC calibration engine. However, directly oversampling the wideband output waveforms of high-speed DACs is inefficient, if even possible. Thus on-chip measurement circuits typically sample a subset of DAC output symbols. As long as the subset is representative, and corresponding digital DAC input sequence is known, the calibration can still be performed.

Meanwhile, previously proposed on-chip DAC calibrators only take samples of the DAC output waveform at integer multiples of the DAC sampling period (Ts). Thus, any spectral content above the first Nyquist zone gets aliased and corrupts the measurements. To minimize such error, (a) sampling should take place after a reconstruction filter, and (b) the reconstruction filter should be sharp enough to reject most of the spectral content above the first Nyquist zone. Both conditions are hard to meet, because (a) a reconstruction filter may need to be located off-chip for best performance, and (b) an on-chip filter may not be sharp enough to avoid significant aliasing artifacts. This is especially true for demanding wideband applications, such as instrumentation and communications.

Accordingly, it would be desirable to be able to provide an accurate measurement of one or more performance characteristics of a DAC, and possibly calibrating the performance of the DAC, without resorting to solutions which require off-device test equipment such as an oscilloscope, spectrum analyzer, etc.

SUMMARY

According to one aspect of the invention, a method comprises: providing a digital input signal to an input of a digital-to-analog converter (DAC) and, in response to a DAC clock signal, the DAC converting the digital input signal to an analog output signal; generating a sampling clock signal from the DAC clock signal, wherein the sampling clock signal has a plurality of pulses each spaced apart from each other in time by a plurality of periods of the DAC clock signal, wherein a timing of at least one of the pulses of the sampling clock signal is offset with respect to the DAC clock signal by a first fraction of a DAC clock period, and wherein a timing of at least another one of the pulses of the sampling clock signal is offset with respect to the DAC clock signal by a second fraction of the DAC clock period which is different than the first fraction; sampling-and-holding the analog output signal in response to the sampling clock signal to produce a sampled-and-held analog output signal; and digitizing the sampled-and-held analog output signal to output digital values corresponding to analog values of the sampled-and-held analog output signal.

In some embodiments, the method further comprises varying over time a number of the plurality of periods of the DAC clock signal by which the plurality of pulses of the sampling clock signal are spaced apart from each other in time from one pulse to another pulse.

In some embodiments, the method further comprises generating a sampling clock signal from the DAC clock signal by dividing a frequency of the DAC clock signal by a value $N_{DIV}>1$ to produce a divided DAC clock signal.

In some versions of these embodiments, the method further comprises varying a number of the plurality of periods of the DAC clock signal by which the plurality of pulses of the sampling clock signal are spaced apart from each other in time from one pulse to another pulse by varying the value $N_{DIV}$ over time.

In some versions of these embodiments, the method further includes varying a phase of the sampling clock signal over time in coarse steps as multiples of the DAC clock period, and in fine steps as fractions of the DAC clock period.

In some versions of these embodiments, the method further includes varying a number of the plurality of periods of the DAC clock signal by which a pulse of the sampling clock signal is delayed with respect to the analog output signal of the DAC, wherein dividing the frequency of the DAC clock signal by a value $N_{DIV}>1$ comprises applying the DAC clock signal to a counter and outputting a counter output signal, and wherein varying the number of the plurality of periods of the DAC clock signal by which a pulse of the sampling clock signal is delayed with respect to the analog output signal of the DAC includes comparing the counter output signal to a coarse timing setpoint.

In some versions of these embodiments, the method further includes varying a number of the plurality of periods of the DAC clock signal by which a pulse of the sampling clock signal is delayed with respect to the analog output signal of the DAC, wherein dividing the frequency of the DAC clock signal by a value $N_{DIV}>1$ comprises applying the DAC clock signal to a counter, and wherein varying the number of the plurality of periods of the DAC clock signal by which the pulse of the sampling clock signal is delayed with respect to the analog output signal of the DAC includes changing a value of $N_{DIV}$ to have a larger or smaller value.

In some versions of these embodiments, varying the phase of the sampling clock signal over time includes producing with a delay line a plurality of candidate sampling clock signals each having a different phase with respect to each other, and over time selecting different ones of the candidate sampling clock signals to be the sampling clock signal.

In some embodiments, the digital signal is a periodic signal having a period at least two times greater than a period of the DAC clock signal.

In some embodiments, the digital signal is one selected from a group consisting of: a periodic pseudorandom bitstream, a digital chirp signal, and a multi-tone signal.

In some embodiments, the plurality of pulses of the sampling clock signal are all spaced apart from each other in time by at least two periods of the DAC clock signal.

In some embodiments, generating the sampling clock signal from the DAC clock signal includes adjusting the timing of a plurality of the pulses of the sampling clock signal to be offset with respect to the DAC clock signal by at least two different fractions of the DAC clock period, including at least a first fraction less than or equal to ½ of the DAC clock period; and a second fraction greater than or equal to ½ of the DAC clock period.

In some embodiments, the method further comprises processing the digital values to obtain an indication of a nonlinear distortion produced by the DAC.

In some versions of these embodiments, processing the digital values output by the digitizer to obtain an indication of a nonlinear distortion produced by the DAC includes comparing the digital values to the digital input signal, and wherein the method further comprises obtaining calibration data for calibrating the DAC to at least partially compensate for the nonlinear distortion.

In some embodiments, the method further comprises processing the digital values output by the digitizer to measure a frequency response of the DAC.

According to another aspect of the invention, a device comprises: a digital-to-analog converter (DAC) having an input configured to receive a digital input signal and an output configured to output an analog output signal in response to a DAC clock signal; a sample-and-hold circuit connected to the output of the DAC and configured to sample and hold the analog output signal in response to a sampling clock signal to output a sampled-and-held analog output signal; a digitizer connected to an output of the sample-and-hold circuit to receive the sampled-and-held analog output signal and in response thereto to output digital values corresponding to the sampled-and-held analog output signal; and a sampling clock signal generator connected to receive the DAC clock signal and in response thereto to generate the sampling clock signal. The sampling clock signal has a plurality of pulses each spaced apart from each other in time by a plurality of periods of the DAC clock signal, wherein a timing of at least one of the pulses of the sampling clock signal is offset with respect to the DAC clock signal by a first fraction of a DAC clock period, and wherein a timing of at least an other one of the pulses of the sampling clock signal is offset with respect to the DAC clock signal by a second fraction of the DAC clock period which is different than the first fraction.

In some embodiments, the sampling clock signal generator comprises: a coarse time-base generator configured to divide a frequency of the DAC clock signal and to provide a divided DAC clock signal; and a fine delay adjuster configured to output the sampling clock signal by applying a selectable delay to the divided DAC clock signal, wherein the selectable delay includes fractions of a clock period of the DAC clock signal.

In some versions of these embodiments, a phase of the coarse time-base generator is phase adjustable in steps of a period of the DAC clock period.

In some versions of these embodiments, the coarse time-base generator comprises a counter.

In some versions of these embodiments, the counter is configured to divide a frequency of the DAC clock signal by a value $N_{DIV}>1$ and output a counter output signal, and wherein the coarse time-base generator further includes a comparator having a first input connected to receive the counter output signal and a second input connected to receive a variable coarse timing setpoint, and wherein the comparator is configured to vary a number of the plurality of periods of the DAC clock signal by which the plurality of pulses of the sampling clock signal are delayed with respect to the analog output signal of the DAC over time by comparing the counter output signal to the variable coarse timing setpoint to output the divided DAC clock signal.

In some versions of these embodiments, the counter is configured to divide a frequency of the DAC clock signal by a value $N_{DIV}>1$ to output a divider output signal, and is further configured to vary the number of the plurality of periods of the DAC clock signal by which the plurality of pulses of the sampling clock signal are delayed with respect to the analog output signal of the DAC from one pulse to another pulse over time by changing a value of $N_{DIV}$ to have a larger or smaller value.

In some embodiments, the device further comprises a processor connected to an output of the digitizer and configured to process the digital values output by the digitizer to obtain an indication of a nonlinear distortion produced by the DAC includes comparing the digital values to the digital input signal, and wherein the method further comprises obtaining calibration data for calibrating the DAC to at least partially compensate for the nonlinear distortion.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

As noted above, high-performance digital-to-analog converters (DACs), for example for instrumentation and communications applications, have stringent linearity and spectral purity requirements, which are difficult to meet with analog circuit design techniques alone. Increasingly, digital signal processing techniques are used to improve the performance of the DACs by predistorting the digital DAC input to compensate for distortion in the analog DAC circuits. This approach requires a method of measuring the DAC error to determine an optimal predistorter configuration.

Even when no such predistortion techniques are employed, it is often desired or necessary to be able to accurately measure DAC performance such as nonlinear distortion or frequency response, for calibration or even just for component qualification.

Figure 1:
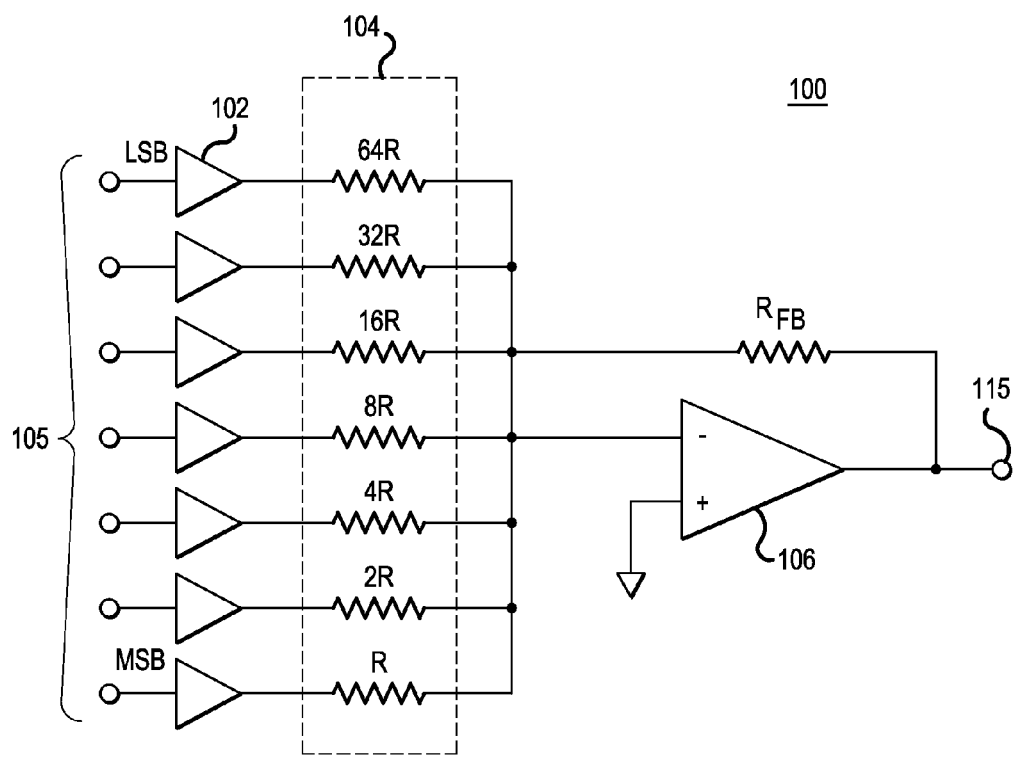
FIG. 1 illustrates an example of a simple and basic digital-to-analog converter (DAC).
Figure 2:
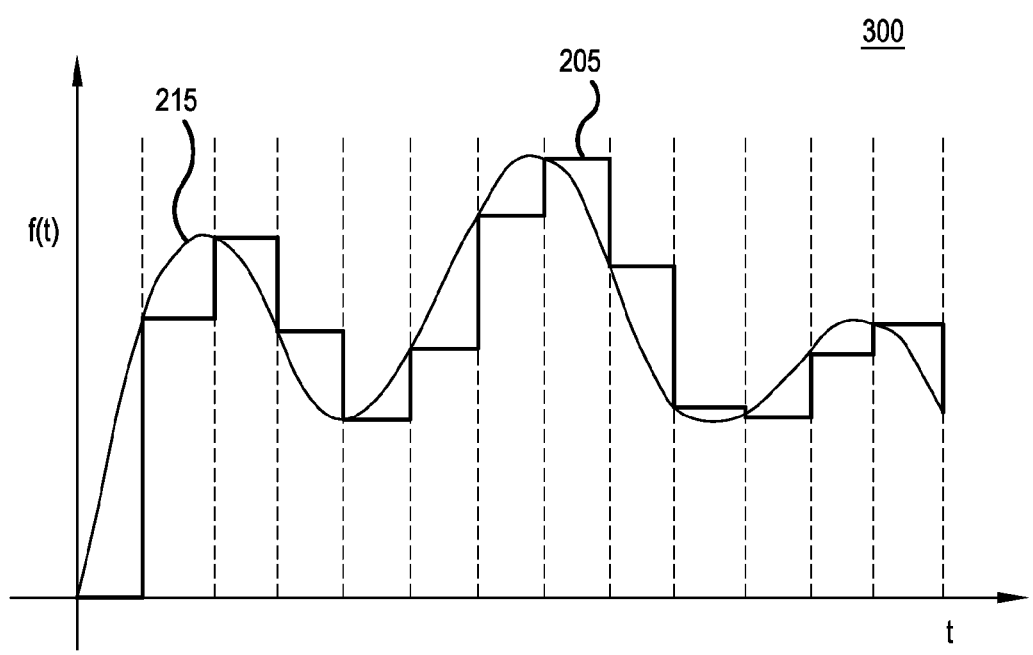
FIG. 2 illustrates an example piecewise constant output of an idealized DAC before and after passing through a reconstruction filter.
Figure 3A:
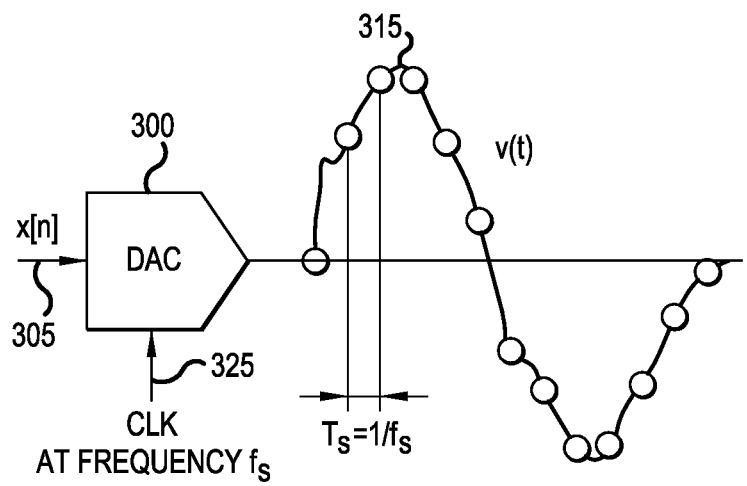
FIG. 3A illustrates an example of sampling the output of a DAC at the DAC sampling rate.

FIG. 3A illustrates an example of sampling the output of a DAC 300 at the DAC sampling rate $f_S$. Here, DAC 300 receives a digital input signal 305 and a DAC clock signal 325 and converts digital input signal 305 to an analog output signal 315 (v(t)). FIG. 3A shows samples 316 of analog output signal 315 spaced apart by the DAC sampling period $T_S=1/f_S$.

Given DAC 300 running at a DAC conversion frequency of $f_S$, it is often assumed that measuring its output with a timing resolution of one DAC clock period $T_S=1/f_S$, is sufficient for characterizing its distortion. However, this is the case only if analog output signal 315 of DAC 300 is filtered with a reconstruction filter prior to sampling to remove any frequencies above the first Nyquist band (from 0 to $f_S/2$).

Figure 3B:
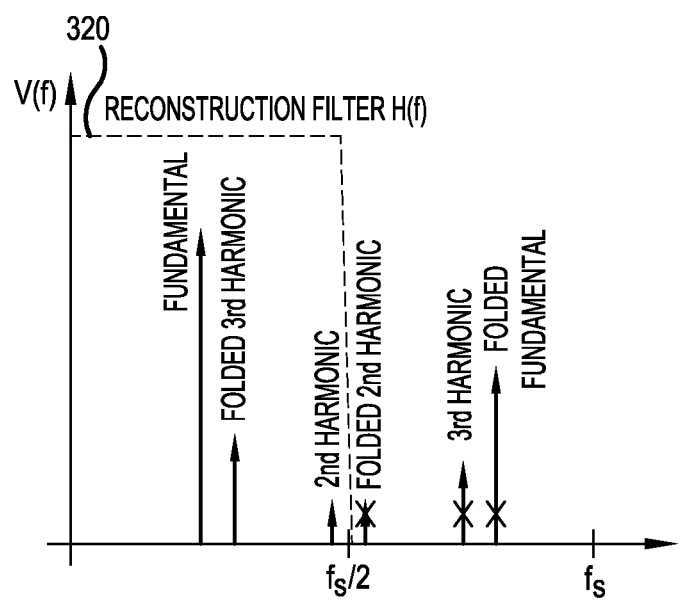
FIG. 3B illustrates an example of requirements for a reconstruction filter to avoid aliasing.

FIG. 3B illustrates an example of requirements for a reconstruction filter 320 having a transfer function H(f) to avoid aliasing. As shown in FIG. 3B, reconstruction filter 320 has a perfectly sharp transition to remove any frequencies above the first Nyquist band (from 0 to $f_S/2$) to ensure that no aliasing occurs when sampling at $f_S$.

However, practical reconstruction filters cannot be infinitely sharp and leave significant residue of higher frequency components generated by the DAC. Also, in many cases where the DAC is implemented in an integrated circuit (IC), the reconstruction filter may be implemented off-chip, requiring off-chip measurement equipment to measure the signal after the reconstruction filter. As discussed above, the use of such off-chip measurement equipment is undesirable for many reasons.

An alternative approach to measuring DAC performance is to oversample the analog output signal output by a DAC by a large enough oversampling ratio (OSR) to avoid aliasing altogether.

However, in general, a digitizer capable of actually oversampling the wideband analog output signal generated by a modern high-speed DAC with an oversampling ratio OSR sufficient to avoid aliasing altogether would be too complex and power-hungry to integrate on-chip for diagnostic and calibration purposes.

Beneficially, the inventor has appreciated that because the sequence of the digital input signal to the DAC is known, taking a continuous stream of samples of the analog output signal output by the DAC is not necessary in order to measure or characterize performance characteristics of the DAC such as frequency response and non-linear distortion. Instead, a set of representative (but not necessarily contiguous) samples of the analog output signal can be recorded with its corresponding digital input symbol (or a history of several input symbols, if history effects are considered) and the set of samples may be processed to measure or characterize performance characteristics of the DAC.

Figure 4:
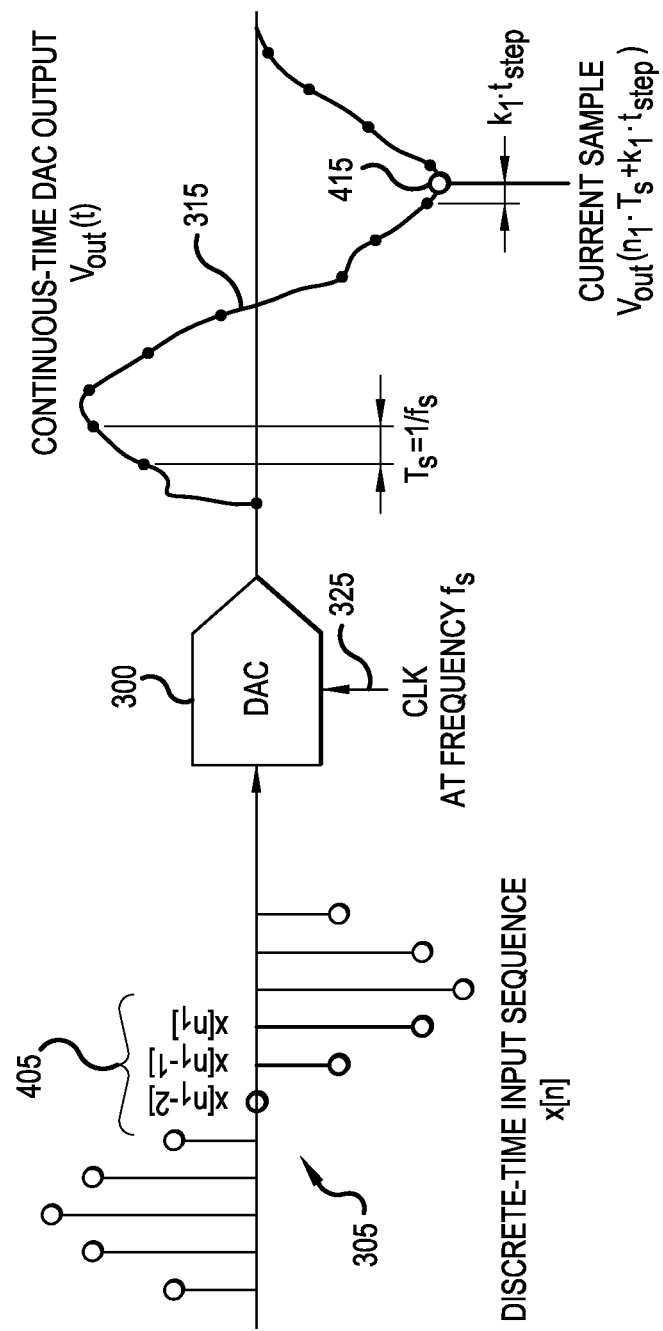
FIG. 4 illustrates an example of sampling a DAC output with fine timing adjustment while keeping track of the history of DAC input symbols that could affect a current sample.

FIG. 4 illustrates an example of sampling analog output signal 315 ($V_{OUT}(t)$) with a fine timing adjustment of $T_{STEP}$ while keeping track of the history of DAC input symbols 415 that could affect the current sample, where n (e.g., $n_1$) is the index of the current digital input sample, and k (e.g., $k_1$) is an index of a time slot (also referred to as a time window) among a plurality (e.g., K) of predefined time slots within the DAC sampling period $T_S$.

The inventor has appreciated that by providing an arrangement wherein a plurality of fine time slots are created having steps of duration $T_{STEP}$, where $T_{STEP}=T_S/OSR$, then the exact timing of sampling the analog output signal within each DAC sampling period $T_S$ can be adjusted in steps of $T_{STEP}$, thereby effectively oversampling analog output signal 315 of DAC 300 by the oversampling ratio OSR without requiring the use of any clock which is faster than the DAC clock signal itself. In particular, for example, the phase of the sampling clock used to sample the analog output signal of the DAC may be adjusted in steps of duration $T_{STEP}$ to obtain a set of representative, non-contiguous, samples of the analog output signal which may be processed to determine one or more performance characteristic of the DAC. Such an arrangement can therefore be implemented with complexity and power consumption significantly less than an actual full oversampling ADC. Such an arrangement is referred to herein as "equivalent-time sampling." When used to sample the analog output signal of a DAC, this is referred to as "equivalent-time analog output signal sampling." When used to measure a performance characteristic of the DAC, this is referred to as an "equivalent-time measurement." When used to calibrate the DAC, this is referred to as "equivalent-time DAC calibration."

Figure 5:
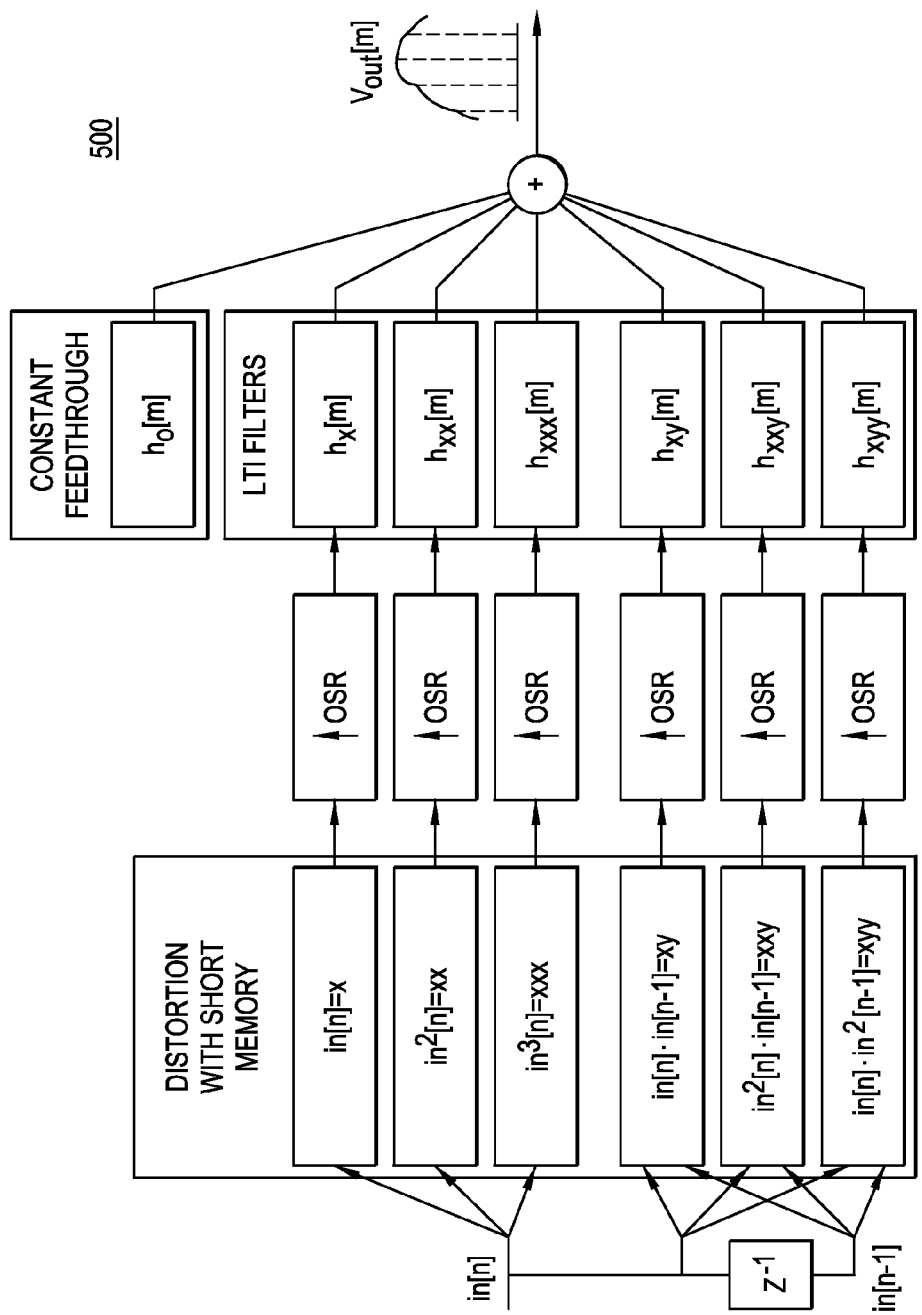
FIG. 5 illustrates an example of a DAC distortion model in an oversampled domain.

To better explain these concepts, reference is made to FIG. 5, which illustrates an example of a DAC distortion model in an oversampling domain in the context of an equivalent-time DAC calibration. However, it should be understood that these principles extend to equivalent-time measurements in contexts where no DAC calibration is performed.

The DAC dynamic non-linearity model illustrated in FIG. 5 considers non-linear interactions of the current DAC input sample x=in[n] with itself as well as with the previous sample y=in[n−1]. The model can also be trivially extended to more previous samples and higher than third-order interactions. The current DAC input sample x as well as non-linear distortion terms $xx=in^2[n]$, $xxx=in^3[n]$, etc. are upsampled by oversampling ratio OSR and passed through their respective linear FIR filters $h_x[m]$, $h_{xx}[m]$, $h_{xxx}[m]$, etc. The results are then added together and summed with a constant feedthrough waveform $h_0[m]$ (which is independent of the DAC input and repeats every DAC conversion cycle).

Given the coefficients of the filters h . . . [m], one can determine an appropriate digital DAC predistortion that cancels out the distortion of the DAC. Thus, what is required is a method of finding the filter coefficients using equivalent-time measurements.

To do this, one can express each measured sample $V_{OUT}(t)=V_{OUT}[n \cdot OSR+k]$ of DAC analog output signal 315 as a linear combination (linear function) of the (known) history of DAC input samples $x[n]=in[n]$ and distortion terms ($xx[n]=in^2[n]$, $xy[n]=in[n] \cdot in[n-1]$, $xxx[n]=in^3[n]$, etc.). The coefficients of the combination are the (unknown) coefficients of FIR filters $h_x[m]$, $h_{xx}[m]$, $h_{xxx}[m]$, etc.

In vector form, this is expressed by equation (1):

$$V_{OUT}[n \cdot OSR + k] = [1\ x[n]\ x[n-1]\ \ldots\ x[n-N]\ xx[n]\ \quad (1)$$

$$xx[n-1]\ \ldots\ xx[n-N]\ xy[n]\ \ldots\ ] \begin{bmatrix} h_0[k] \\ h_x[0 \cdot OSR + k] \\ h_x[1 \cdot OSR + k] \\ \ldots \\ h_x[N \cdot OSR + k] \\ h_{xx}[0 \cdot OSR + k] \\ h_{xx}[1 \cdot OSR + k] \\ \ldots \\ h_{xx}[N \cdot OSR + k] \\ h_{xy}[0 \cdot OSR + k] \\ \ldots \end{bmatrix}$$

where N represents the number of history of DAC samples taken into account, and k is the index of the sample among OSR time slots within the DAC sampling period $T_S$. As one equation with many unknowns, it is impossible to solve. However, a system consisting of multitude of such equations for different samples of $V_{OUT}(t)=V_{OUT}[n \cdot OSR+k]$ can be solved, for example, in a least-squares sense, using standard linear algebra techniques, provided that a representative set of samples is collected.

To make sure that the set of samples is representative, the following criteria should be satisfied.

First, DAC 300 should be operating with a digital input signal 305 that exercises a representative subset of all possible combinations of neighboring samples. That is, if the DAC non-linearity model takes into account the current sample x=in[n] and the previous sample y=in[n−1], a representative set of possible (x, y)-tuples should be encountered during calibration. For example, a sufficiently long pseudo-random sequence would suffice. A set of swept-frequency sinusoidal signals would exercise current/previous sample combinations, but would not be sufficient if pre-previous sample z=in[n−2] were included in the model.

Second, samples of the waveform of DAC analog output signal 315 should be collected throughout the DAC sampling period $T_S$, i.e. for a variety of k from 0 to (OSR−1).

Also, the systems of equations for different values of k are uncoupled such that they can be solved separately, significantly reducing the computational complexity.

Obtaining the systems of equations above does not require samples of analog output signal $V_{OUT}(t)$ to be taken every $T_{STEP}=T_S/OSR$, which would require a very fast analog-to-digital converter (ADC). In fact, two consecutive samples, $V_{OUT}(t_1)=V_{OU}[n_1 \cdot OSR+k_1]$ and $V_{OUT}(t_2)=V_{OUT}[n_2 \cdot OSR+k_2]$, can be arbitrarily far apart if, for example, $n_1=0$ and $n_2=1000000$. Only the timing of each sample relative to a (known) history of DAC input samples (which is referred to here as "equivalent-time") is important.

One possible method of implementing an equivalent-time on-chip calibrator is to add an adjustable fine clock delay adjustment to a calibration ADC. The fine delay adjustment allows the timing of, or window for, each sample of analog output signal 315 of DAC 300 to be adjusted in steps of $T_{STEP}=T_S/OSR$ with respect to the DAC clock period $T_S$, thereby enabling equivalent-time oversampling by a factor of OSR. In some embodiments, this may be accomplished by adjusting the phase of the sampling clock signal in steps of $T_{STEP}=T_S/OSR$ spanning a period of the DAC clock signal 325.

Example embodiments of devices/systems and methods for obtaining such equivalent-time measurements will now be described. Although example embodiments are described below in the context of DAC calibration, it should be understood that the principles which are discussed, particularly involving equivalent-time sampling and equivalent-time measurement of a DAC analog output signal, are not limited to this context. In general these principles may be applied to other measurements and evaluations of DAC performance, including as non-limiting examples non-linear distortion and frequency response of the DAC.

One possible method of implementing an equivalent-time on-chip calibrator is to add an adjustable fine clock delay adjuster to a calibration ADC. The fine delay adjuster allows each sample within the DAC sampling period $T_S$ to be moved in steps of $T_S/OSR$, thereby enabling equivalent-time oversampling by a factor of OSR.

Figure 6:
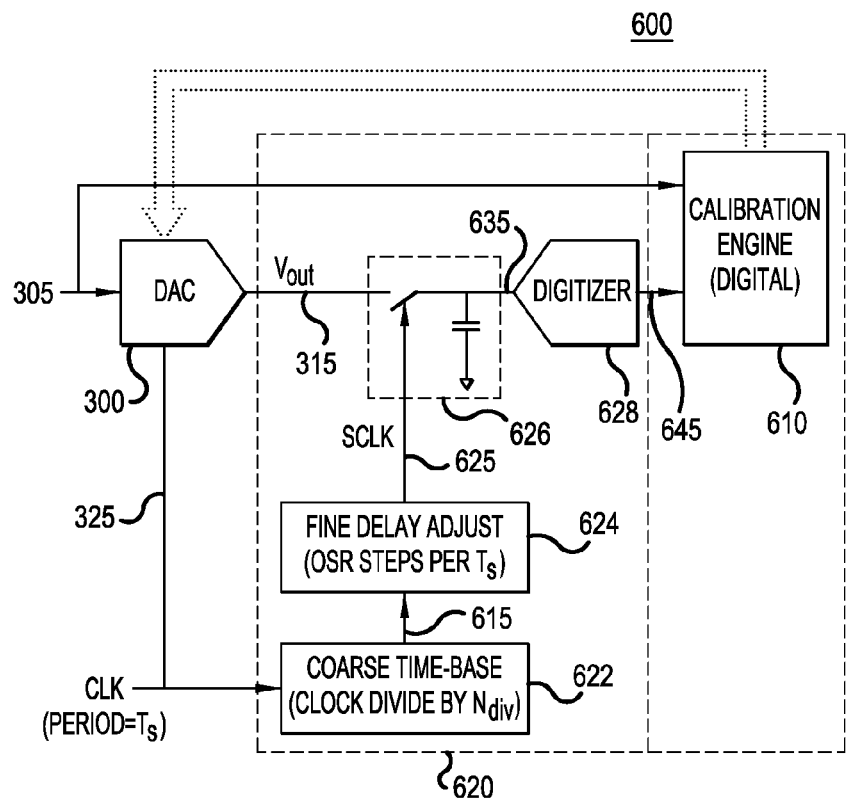
FIG. 6 illustrates an example embodiment of a device including a sampler for sampling an output of a DAC and a calibration engine employing the sampler output.

FIG. 6 illustrates an example embodiment of a device 600 including a sampler 620 which employs equivalent-time measurements for sampling an output of DAC 300, and a calibration engine 610 employing the sampler output 645. In some embodiments, device 600 may be incorporated in a single integrated circuit (IC) or chip.

Sampler 620 includes a coarse time-base generator 622, a fine delay adjuster 624, a sample-and-hold circuit 626, and a digitizer 628.

Figure 7:
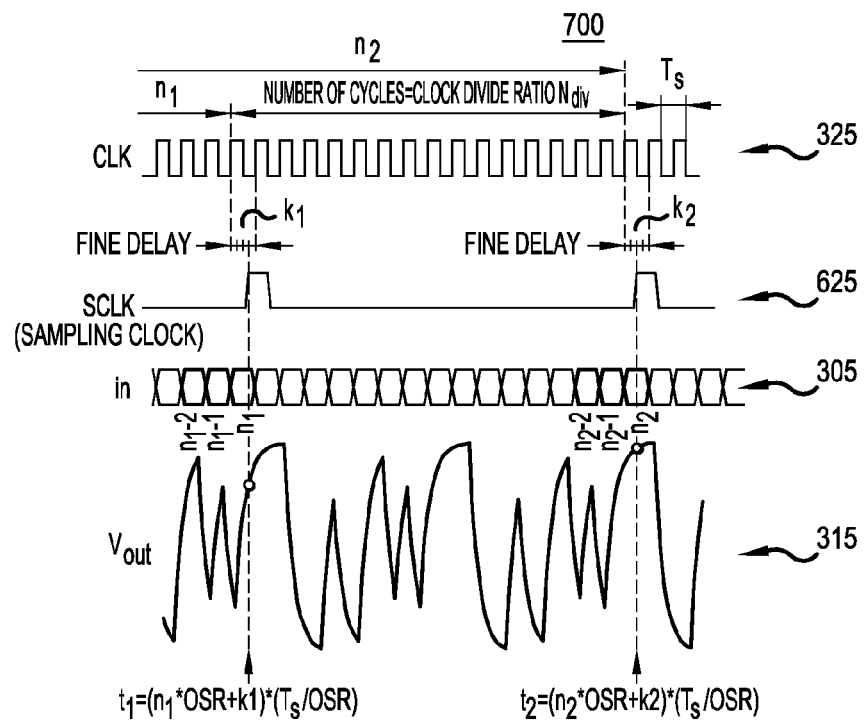
FIG. 7 illustrates an example timing diagram for the device of FIG. 6.

FIG. 7 illustrates an example timing diagram 700 for the device 600 of FIG. 6.

In operation, DAC 300 receives digital input signal 305, and, in response to DAC clock signal (CLK) 325, converts digital input signal 305 to analog output signal 315. Coarse time-base generator 622 receives DAC clock signal 325 and a programmed divider value $N_{DIV}$, and in response outputs a divided DAC clock signal 615 having a frequency of $f_S/N_{DIV}$ (or conversely a period of $T_S*N_{DIV}$). Fine delay adjuster 644 receives divided DAC clock signal 615 and in response to a delay adjustment signal (not shown) outputs a sampling clock signal 625 to sample-and-hold circuit 626. Sample-and-hold circuit 626 samples-and-holds analog output signal 315 in response to sampling clock signal 625 to produce a sampled-and-held analog output signal 635. Digitizer 628 digitizes the sampled-and-held analog output signal 635 to output digital values 645 corresponding to analog values of the sampled-and-held analog output signal 635.

In other embodiments, the ordering and/or operation of coarse time-base generator 622 and fine delay adjuster 624 may be reversed such that fine delay adjuster 624 first operates on DAC clock signal 325, and then coarse time-base generator 622 operates on the output of fine delay adjuster 624. In general, coarse time-base generator 622 and fine delay adjuster 624 operate together to generate sampling clock signal 625 from DAC clock signal 325. Beneficially, as seen in FIG. 7, sampling clock signal 625 has a plurality of pulses each spaced apart from each other in time by a plurality of periods $T_S$ of DAC clock signal 325, wherein a timing of at least one of the pulses of sampling clock signal 625 is offset with respect to DAC clock signal 325 by a first fraction (e.g., $k_1$) of DAC clock period $T_S$, and wherein a timing of at least an other one of the pulses of sampling clock signal 625 is offset with respect to DAC clock signal 325 by a second fraction (e.g., $k_2$) of DAC clock period $T_S$ which is different than the first fraction.

In practice, the number ($N_{DIV}$) of DAC clock periods $T_S$ which elapse between two neighboring samples can be very large to give digitizer 628 more time to convert each sample, thus allowing it to be more accurate. Also, coarse time-base generator 622 does not need to be a divide-by-constant $N_{DIV}$ circuit—it can be some state machine that waits for digitizer 628 to convert one sample before taking the next sample. However, divided DAC clock signal 615 output by coarse time-base generator 622 should be precisely aligned with full-rate DAC clock signal 325.

Calibration engine 610 should also know the history in[$n_i$], in[$n_i$-1], in[$n_i$-2], . . . of digital DAC inputs immediately preceding each sample taken on a CLK cycle $n_i$.

Given the history of digital DAC input in[$n_i$], in[$n_i$-1], in[$n_i$-2], . . . and a digitized sample $V_{out}(t_i)=V_{out}[n_i·OSR+k_i]$ of DAC analog output signal 315, calibration engine 610 records a corresponding linear equation as described above. With multiple representative samples $V_{out}(t_i)$ taken from a sufficiently active DAC analog output signal 315, a system of multiple equations is generated and can be solved for the parameters h . . . [m] of the DAC distortion model of FIG. 5. In some embodiments, such calibration may be performed in the background assuming that DAC 300 is sufficiently exercised during its normal operation.

DACs used in communication systems, for example, are in general guaranteed to be active (and output a representative waveform for DAC analog output signal 315, such as a pseudo-random pattern) during normal operation and, therefore, can benefit greatly from such background calibration.

However, instrumentation DACs may be configured always to output a degenerate waveform (such as a single-tone sinusoid), which would not provide sufficiently diverse samples to calibration engine 610. As a result, the system of equations for unknowns h . . . [m] would be underdetermined.

Instead, an instrumentation DAC is often permitted to perform one-time or periodic calibration as a separate mode of operation, called foreground calibration. A dedicated foreground calibration step allows configuring the DAC to generate waveforms that facilitate calibration (pseudo-random patterns, sinusoidal frequency sweep, multi-tone stimulus, etc.). Furthermore, in some embodiments the calibration patterns may be made periodic, allowing simplification of the design of sampler 620 for on-chip implementation, and improving its ability to make more accurate low-distortion measurements. Note that if the period of a periodic calibration sequence is large, such a periodic waveform may still be sufficiently complex for performing calibration of the DAC. In some embodiments, a sequence of multiple periodic patterns, such as a sinusoidal frequency sweep or chirp, can also be used during the course of calibration.

Suppose that for performing foreground calibration, DAC 300 is configured to generate some periodic waveform M clock cycles long, i.e. with a period of $T_{in}=M·T_S$. If sampling clock signal 625 is arranged to be fully synchronous with $T_{in}$ (i.e., $N_{div}=m·M$, where m is an integer), then sample-and-hold circuit 626 samples the same point of the waveform of analog output signal 315 on every sampling clock period. Thus, sampled-and-held analog output signal 635 is a DC voltage, making it easy to measure with an on-chip diagnostic ADC, or to route to an off-chip voltmeter via an analog test bus.

To measure $V_{out}$ at multiple time points throughout the period of sampling clock (SCLK) 625, the timing of sampling clock signal 625 relative to the beginning of the $V_{out}$ waveform of analog output signal 315 should be adjustable, both in steps of $T_S$ (coarse adjustment) and in steps of $T_{STEP}=T_S/\text{OSR}$ (fine adjustment, to oversample analog output signal 315 by a particular oversampling ratio OSR).

In that case, the process of acquiring the waveform of analog output signal 315 consists of: (a) setting coarse and fine timing of sampling clock (SCLK) 625 relative to the beginning of the DAC waveform; (b) waiting a few cycles of sampling clock signal 625 for sample-and-hold circuit 626 to settle; (c) digitizing sampled-and-held analog output signal 635 (which is a DC voltage once settled); and (d) repeating steps (a)-(c) for a different set of coarse/fine timing values.

In that case, the sampler 620 of FIG. 6 should be modified accordingly: primarily, coarse time-base generator 622, in addition to dividing DAC clock signal 325 by $N_{DIV}=m\cdot M$, should be capable of adjusting the phase of divided DAC clock signal 615 in steps of $T_S$.

Example embodiments of elements or components which may be included in a sampler for sampling an output of a DAC, such as sampler 620, will be described below. Example embodiments described below may permit general foreground/background calibration using not necessarily periodic DAC signals and/or foreground calibration using periodic DAC signals.

A function of a coarse time-base generator for sampling not necessarily periodic DAC signals, such as coarse time-base generator 622 in FIG. 6, is to give digitizer 628 enough time to convert each sample by sufficiently spacing out neighboring samples. This exact spacing is not very critical, but the following conditions should be satisfied: (1) the spacing should be equal to an integer number of periods $T_S$ of DAC clock signal 325; and (2) if analog output signal 315 is allowed to be periodic with a period $T_{in}$, then the coarse time-base generator should be asynchronous with it to guarantee a collection of representative samples throughout $T_{in}$.

Perhaps the simplest implementation of a coarse time-base generator is a divide-by-$N_{DIV}$ circuit, provided that it can be guaranteed that analog output signal 315 may not be periodic with a period $N_{DIV}\cdot T_S$. If this is not possible to guarantee, then $N_{div}$ can be made configurable. Changing $N_{DIV}$ to different values during calibration ensures that samples are collected at different times throughout $T_{in}$. Alternatively, the coarse time-base generator could be designed to provide coarse phase adjustment, as for calibration using periodic DAC signals, as discussed next.

For sampling an analog output signal 315 having a periodic waveform, the coarse time-base generator outputs a divided DAC clock signal which is fully synchronous with the periodic waveform which is being sampled, with a capability of adjusting the timing of the divided DAC clock signal in steps of the period $T_S$ of DAC clock signal 325. This can be accomplished using a divide-by-$N_{DIV}$ circuit with $N_{DIV}$ now being an integer multiple of the length M of the repeating sequence of samples of analog output signals 315. Two example arrangements for adjusting the phase of the divide-by-$N_{DIV}$ circuit in steps of the period $T_S$ of DAC clock signal 325 are illustrated in FIGS. 8A-B.

Figure 8A:
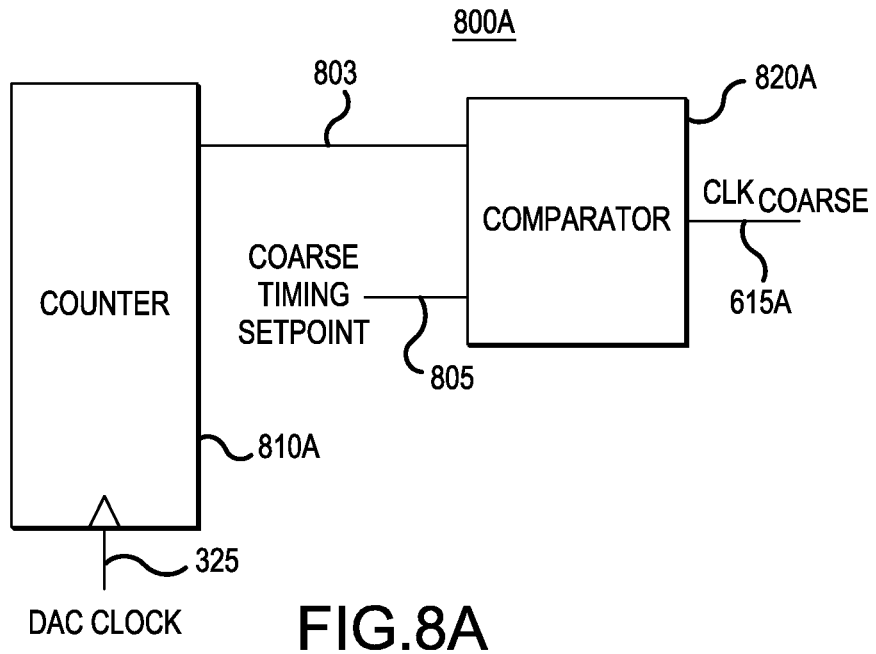
FIG. 8A illustrates a first example embodiment of a coarse time-base generator which may be employed in a sampler for sampling an output of a DAC.

FIG. 8A illustrates a first example embodiment of a coarse time-base generator 800A which may be employed in a sampler (e.g., sampler 620) for sampling an output of DAC 300. Coarse time-base generator 800A includes a counter 810A and a comparator 820A. Counter 810A receives DAC clock signal 325 and in response thereto outputs a counter output signal 803 dependent on a divider value $N_{DIV}$ of counter 810A, which in some embodiments may be programmable. Comparator 820A receives counter output signal 803 and a coarse timing setpoint 805, compares counter output signal 803 to coarse timing setpoint 805, and in response thereto outputs a divided DAC clock signal ($CLK_{coarse}$) 615A.

Figure 9A:
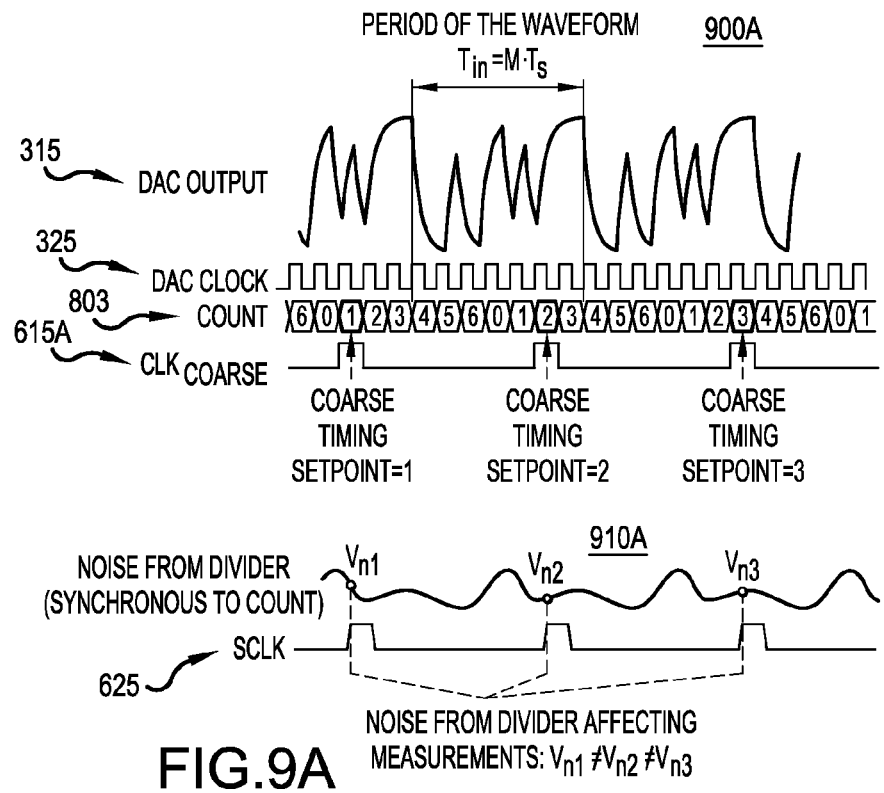
FIG. 9A illustrates an example timing diagram and divider noise waveform for the coarse time-base generator of FIG. 8A.

FIG. 9A illustrates an example timing diagram 900A and divider noise waveform 910A for coarse time-base generator 800A.

Figure 8B:
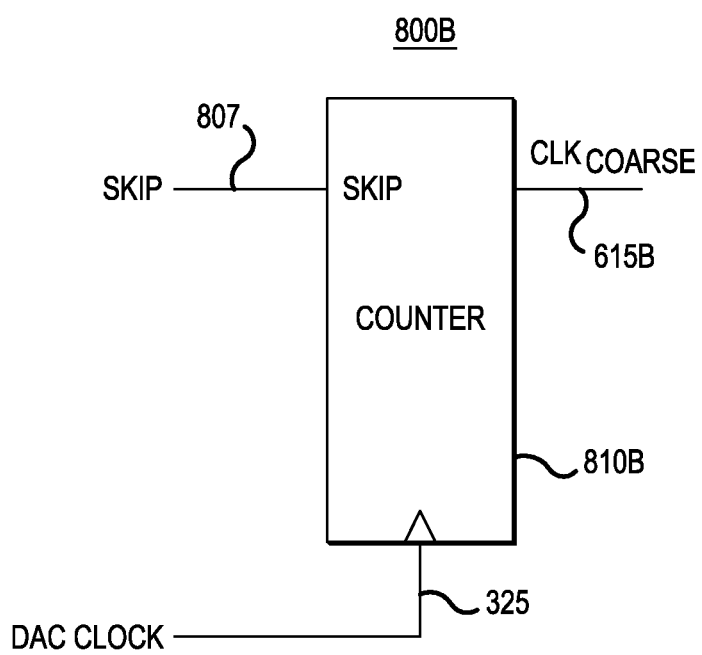
FIG. 8B illustrates a second example embodiment of a coarse time-base generator which may be employed in a sampler for sampling an output of a DAC.

FIG. 8B illustrates a second example embodiment of a coarse time-base generator 800B which may be employed in a sampler (e.g., sampler 620) for sampling an output of DAC 300. Coarse time-base generator 800B includes counter 810B. Counter 810B receives DAC clock signal 325 and a variable skip signal 807, and in response thereto outputs a divided DAC clock signal ($CLK_{coarse}$) 615B dependent on the divider value $N_{DIV}$ of counter 810B, which in some embodiments may be programmable.

Figure 9B:
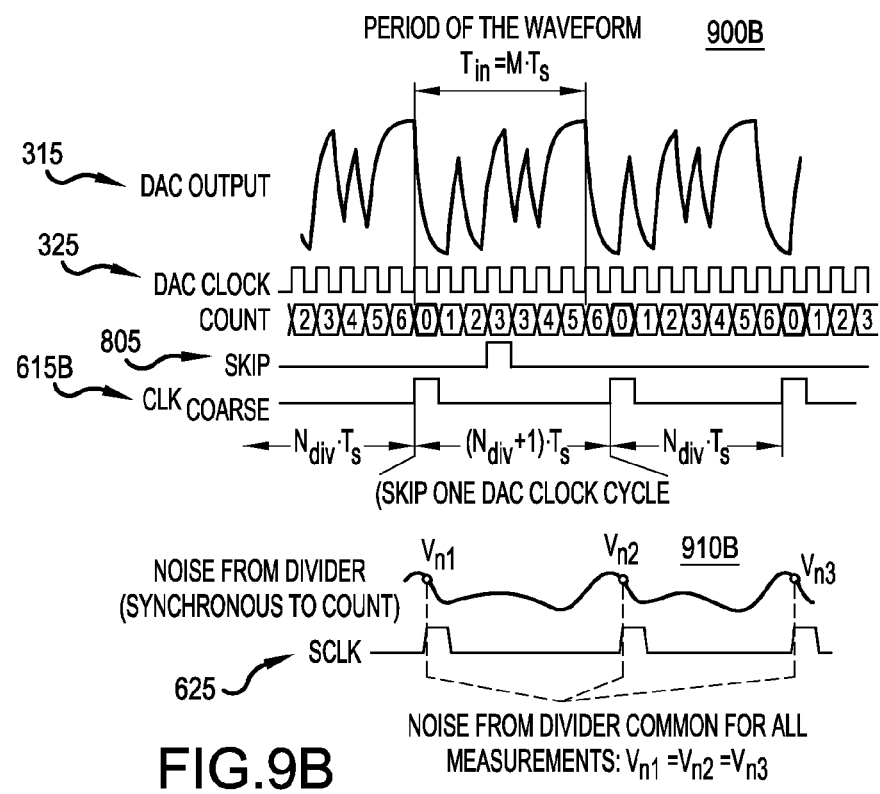
FIG. 9B illustrates an example timing diagram and divider noise waveform for the coarse time-base generator of FIG. 8B.

FIG. 9B illustrates an example timing diagram and divider noise waveform for the coarse time-base generator of FIG. 8B.

While in general either coarse time-base generator 800A or coarse time-base generator 800B may be employed for coarse time-base generator 622 in a sampler such as sampler 620, in some embodiments coarse time-base generator 800B may be advantageous for high-fidelity measurements, because it prevents subharmonic noise from potentially being injected into the power supply, for example, and thereby affecting measurements, as illustrated in divider noise waveforms 910A and 910B. Because divided DAC clock signal 615B is synchronous with the divider count, and therefore also synchronous with the noise generated by the divider, the noise affects all coarse sample positions the same way.

With a coarse time-base generator defining sample timing with a granularity of $T_S$, a fine delay adjuster (also referred to as "time-base generator") is responsible for adjusting sample timing in steps of $T_S$/OSR (to effectively oversample analog output signal 315 by an oversampling ration OSR). As mentioned above, fine timing adjustment may precede or follow the coarse timing adjustment.

In the case where fine timing adjustment is performed prior to coarse time-base generation, then using a full-rate high-quality DAC clock signal 325 facilitates more precise sub-$T_S$ positioning of the sample using interpolation or similar multi-phase clock generation approach. This is particularly advantageous if multiple phases of the full-rate DAC clock signal 325 (at least, true and complement) are already available from whatever circuit in the IC which includes DAC 300 generates DAC clock signal 325. However, if the output of a fine time-base generator clocks a counter in a coarse time-base generator (e.g., coarse time-base generator 800A or coarse time-base generator 800B), then it should not glitch.

In the case where fine timing adjustment is performed after coarse time-base generation, then the fine time-base generator may be allowed to glitch during adjustment, and it need not operate on a high-frequency full-rate DAC clock signal 325. However, without a full-rate DAC clock signal 325, then it is harder to define fine time steps as a precise fraction of $T_S$. One way to mitigate this is to rely on timing calibration, which also allows using, for example, a simple but imprecise tapped delay line as a fine timing generator. Such a delay line can also be used in front of the coarse time-base generator as long as it can be adjusted without producing glitches.

Figure 10:
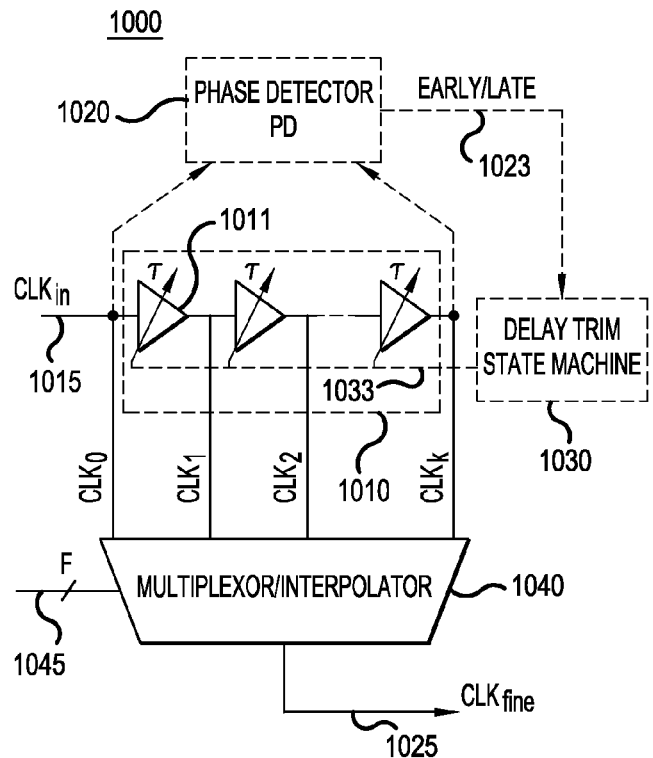
FIG. 10 illustrates an example embodiment of a fine time delay adjuster which may be employed in a sampler for sampling an output of a DAC.

FIG. 10 illustrates an example embodiment of a fine time delay adjuster 1000 which may be employed in a sampler for sampling an output of DAC 300. Fine time delay adjuster 1000 includes a delay line 1010 having a plurality of delay elements 1011; a phase detector 1020; a delay adjustment state machine 1030; and a multiplexer or interpolator 1040.

Figure 11A:
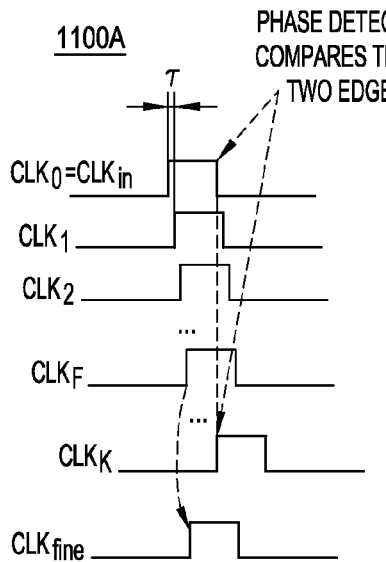
FIG. 11A illustrates a first example of waveforms for a fine time delay adjuster.
Figure 11B:
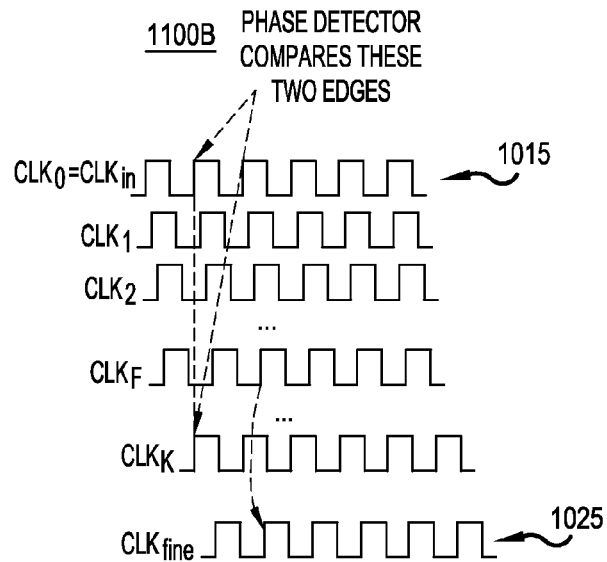
FIG. 11B illustrates a second example of waveforms for a fine time delay adjuster.

FIG. 11A illustrates a first example of waveforms 1100A for fine time delay adjuster 1000, and FIG. 11B illustrates a second example of waveforms 1100B for fine time delay adjuster 1000.

Example operations of fine time delay adjuster 1000 will now be explained.

Delay line 1010 receives an input clock ($CLK_{in}$) 1015. In some embodiments, in particular where fine time delay adjustment is performed after coarse time-base generation, input clock signal 1015 may be divided DAC clock signal 615 as shown in FIG. 6. In other embodiments, in particular where fine time delay adjustment is performed prior to coarse time-base generation, input clock signal 1015 may be DAC clock signal 325.

Input clock signal 1015 is delayed by a series of K delay elements (such as digital buffers) 1011, each with a delay of $\tau$ (e.g., equal to $T_{STEP}$). Multiplexer 1040 selects either $CLK_{in}$ or one of the delayed clocks $CLK_1 \ldots CLK_K$ in response to digital control word (F) 1045 and outputs output clock signal ($CLK_{fine}$) 1025. In some embodiments, in particular where fine time delay adjustment is performed after coarse time-base generation, output clock signal 1025 may be sampling clock signal 625 as shown in FIG. 6. In other embodiments, in particular where fine time delay adjustment is performed prior to coarse time-base generation, output clock signal 1025 may be a phase shifted version of DAC clock signal 325.

Since multiplexer 1040 invariably has some finite delay $\tau_{MUX}$ associated with it, output clock signal 1025 is a somewhat delayed version of the selected clock $CLK_F$. As long as all multiplexer inputs $CLK_0 \ldots CLK_K$ experience the same delay (at least to the first order), output clock signal 1025 is delayed by $\tau_{MUX}+F\cdot\tau$ with respect to the input clock $CLK_{in}$, providing fine clock adjustment with roughly uniform steps $\tau$ (e.g., $T_{STEP}$).

However, even if a fine time step $\tau$ is designed to be equal to $T_S$/OSR, it may vary significantly with process, voltage, and temperature. Accordingly, output clock signal ($CLK_{fine}$) 1025 may be trimmed by making the fine time steps $\tau$ of delay elements 1011 adjustable via delay adjustment state machine 1030 and a control signal 1033 output by delay adjustment state machine 1030 to delay elements 1011, and by aligning the edge of the most delayed clock $CLK_K$ with the edge of the input clock signal 1015 using phase detector 1020. Such trimming may work well when fine time delay adjuster 1000 precedes a coarse time-base generator (e.g., coarse time-base generator 622, 800A, or 800B) and operates on a full-rate DAC clock signal 325, aligning a rising edge to a rising edge, as shown in FIG. 11B. However, this may become more difficult when input clock signal 1015 is divided DAC clock signal 615 from a coarse time-base generator. Nevertheless, so long as the coarse time-base generator produces a pulse of well-defined width $T_S$, as shown in FIG. 11A, the arrangement is operable, with accuracy perhaps somewhat degraded by duty cycle distortion of the input clock signal 1015.

Figure 12A:
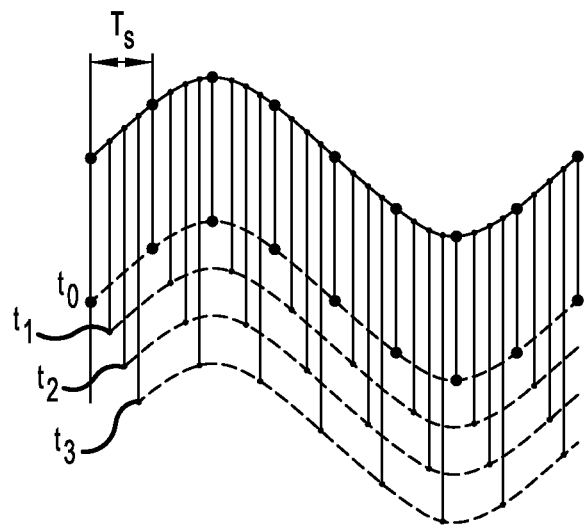
FIG. 12A illustrates calibrating a fine delay adjuster by measuring group delays of a band-limited calibration signal sampled at each of the fine timing settings separately.

Another approach is to allow time step $\tau$ to deviate from an ideal value $T_S$/OSR and to measure and compensate the resulting error in post-processing. To identify the actual timing of the samples, it is sufficient to determine the group delays of a band-limited calibration signal $V_{in}(t)=V_{cal}(t)$ sampled at each of the fine timing settings separately: $V_{cal}(t_0+nT_S)$, $V_{cal}(t_1+nT_S)$, ..., as shown in FIG. 12A for the sinusoid with $f_{in}=f_S/8$. One convenient way to determine group delays is to compute the discrete-time Fourier transforms $V_{cal0}(f)=DTFT\{V_{cal}(t_0+nT_S)\}$, $V_{cal1}(f)=DTFT\{V_{cal}(t_1+nT_S)\}$, ... and divide each of the $V_{cal1}(f), \ldots, V_{cal(K-1)}(f)$ by $V_{cal0}(f)$, chosen as a zero-delay reference. Using the time-shift property of the Fourier transform, $V_{cal1}(f)$ should be equal to $V_{cal0}(f)\cdot\exp(j\cdot 2\pi f(t_1-t_0))=>\arg\{V_{cal1}(f)/V_{cal0}(f)\}=2\pi f(t_1-t_0)=2\pi f\tau_1$ $V_{cal2}(f)$ should be equal to $V_{cal0}(f)\cdot\exp(j\cdot 2\pi f(t_2-t_0))=>\arg\{V_{cal2}(f)/V_{cal0}(f)\}=2\pi f(t_2-t_0)=2\pi f\tau_2$

..., where arg{ } denotes the argument (angle) of a complex number, and $\tau_1, \tau_2, \ldots \tau_K$ are the actual delays of delay elements 1011 of delay line 1010 in FIG. 10. For good measurement accuracy (to filter out measurement noise), linear functions $\phi_1=2\pi f\tau_1$, $\phi_2=2\pi f\tau_2$, etc. may be fitted to data over all non-zero frequency components of $V_{cal}$. Of course, for a single-tone sinusoidal signal $V_{cal}$, the only significant spectral content is at $f=\pm f_{in}$.

A principal reason for imposing a bandwidth limitation constraint on a calibration signal $V_{cal}$ is to avoid aliasing when it is sampled at each of the fine timing settings individually (effective sampling rate is only $f_S$, not OSR·$f_S$, as when the measurements at all the fine timing settings are combined). Therefore, any spectral components of $V_{cal}$ beyond $f_S/2$ should be filtered out. The filter, however, may be a simple low-order filter, because, unlike a typical reconstruction filter, it may not need to preserve spectral components close to the Nyquist band edge. The filter would only be inserted between the DAC output and the input of the sampler during the timing calibration and bypassed in normal operation.

Figure 12B:
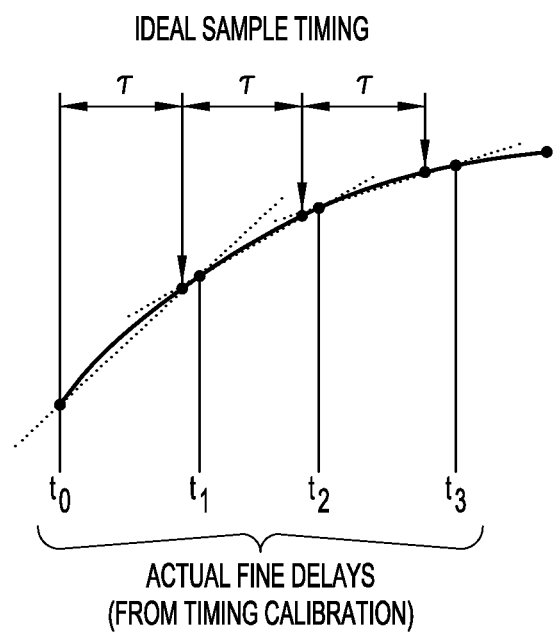
FIG. 12B illustrates timing correction using linear interpolation.

Once the fine timing generator is calibrated, the timing correction may be performed by interpolating between samples taken at the actual fine delay settings (timing of which has been determined during timing calibration). A simple linear interpolation is shown as an example in FIG. 12B, but many other sophisticated interpolation techniques are known in the art.

A MATLAB simulation was performed to evaluate the effectiveness of a sampler (e.g., sampler 620) with a calibrated fine time delay adjuster (e.g., fine time delay adjuster 1000) for characterizing low-order DAC distortion. The simulation modeled the sampler's fine time-base generator with 16 fine timing settings (OSR=16) and a hypothetical timing error with about 10% maximum error around the intermediate delay setting. To calibrate the timing, a sinusoidal test signal at $f_S/16$ was passed through a $2^{nd}$-order reconstruction filter with a cut-off frequency set to $f_S/32$.

Figure 13A:
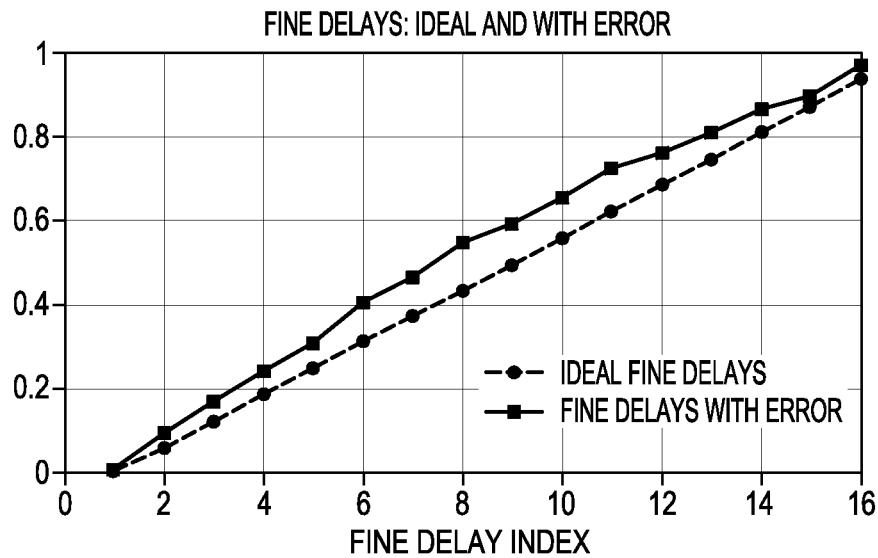
FIG. 13A illustrates ideal fine timing delays for an embodiment of a fine delay adjuster with 16 fine timing settings, and the timing delays with a 10% delay error around the intermediate delay settings.
Figure 13B:
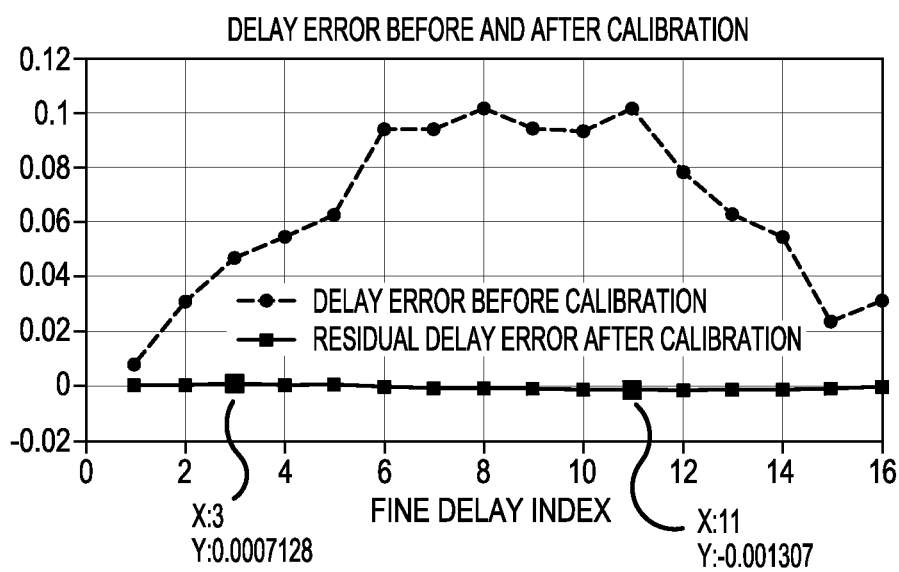
FIG. 13B illustrates the delay error of a fine delay adjuster with 16 fine timing settings and a 10% delay error around the intermediate delay setting, before and after calibration.

In particular, FIG. 13A illustrates ideal fine timing delays for an embodiment of a fine delay adjuster with 16 fine timing settings, and the timing delays with a 10% delay error around the intermediate delay setting, and FIG. 13B illustrates the delay error of a fine delay adjuster with 16 fine timing settings and a 10% delay error around the intermediate delay setting, before and after calibration. As evident from FIG. 13B, the 10% initial error is calibrated out to about ±0.13% residual error.

When sampling signals which are not necessarily periodic, each sample carries unique information and should be measured and converted to a digital value individually. Fortunately, the samples can be widely separated in time, allowing the use of accurate low-speed sample-and-hold and digitizer circuitry.

When sampling signals which are necessarily periodic, the sampler (e.g., sampler 620) can be simplified and optimized even further. If sampling clock (SCLK) 625 is arranged to be fully synchronous with digital input signal 305 and is left at a particular coarse/fine delay setting, sample-and-hold circuit 626 samples the same point of the waveform of analog output signal 315 on every cycle of sampling clock signal 625.

Figure 14:
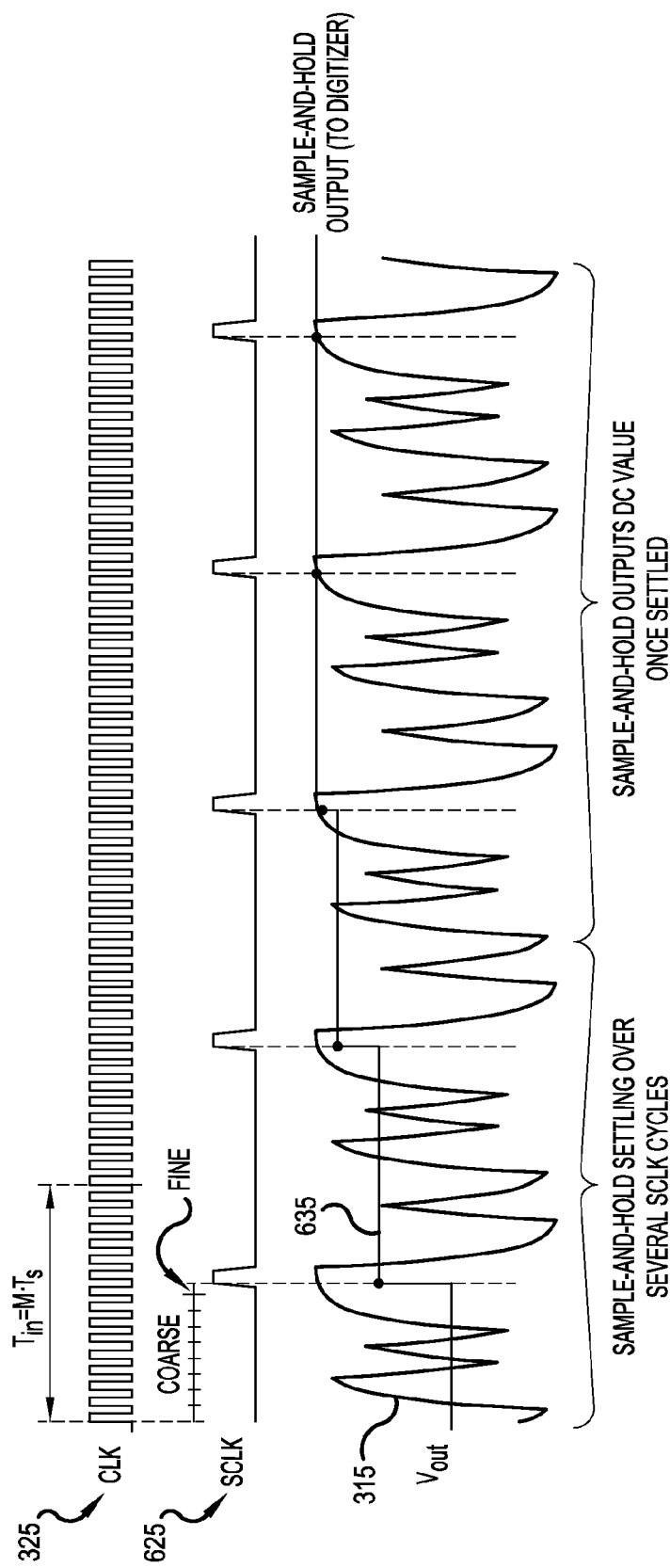
FIG. 14 illustrates an example of a sample-and-hold operation for sampling a periodic waveform at the same time every period.

Therefore, sampled-and-held analog output signal 635 output by sample-and-hold circuit 626 does not have to fully settle in one sample. As shown in FIG. 14, sample-and-hold circuit 626 sees the same instantaneous voltage on every sample, so it can take multiple samples to settle to the final DC value.

However, for this to be true, sample-and-hold circuit 626 should only sample analog output signal 315 for a very short time, usually on the rising (or falling) edge of sampling clock signal 625, and hold it at all other times. This is in contrast with track-and-hold circuits which are typically used in analog-to-digital converters, which track the input signal during half of the clock cycle and hold it during the other half. One way of implementing sample-and-hold circuit 626 is to generate a very short sampling pulse that controls a sampling switch. This technique, with some form of a diode bridge as a sampling switch, is typically used in laboratory sampling oscilloscopes.

In the case where sampling clock signal 625 is fully synchronous with analog output signal 315, the output sample-and-hold circuit 626 is a DC voltage. As such, it can be measured with either a slow but accurate on-chip ADC, or, as is often more practical, outputted to off-chip measurement equipment through an analog test bus. The ADC or the analog test bus may be shared with other diagnostic analog test points used for other on-chip DC or low-bandwidth measurements. As measurement linearity may be extremely important, the analog test bus may be implemented as a simple shielded on-chip trace, possibly multiplexed between multiple test points using analog switches, but without any buffer amplifiers, which may significantly distort the sampler output voltage. The leakage due to analog switches also should also be tightly controlled, so that its effect on the sampler is negligible.

Figure 15:
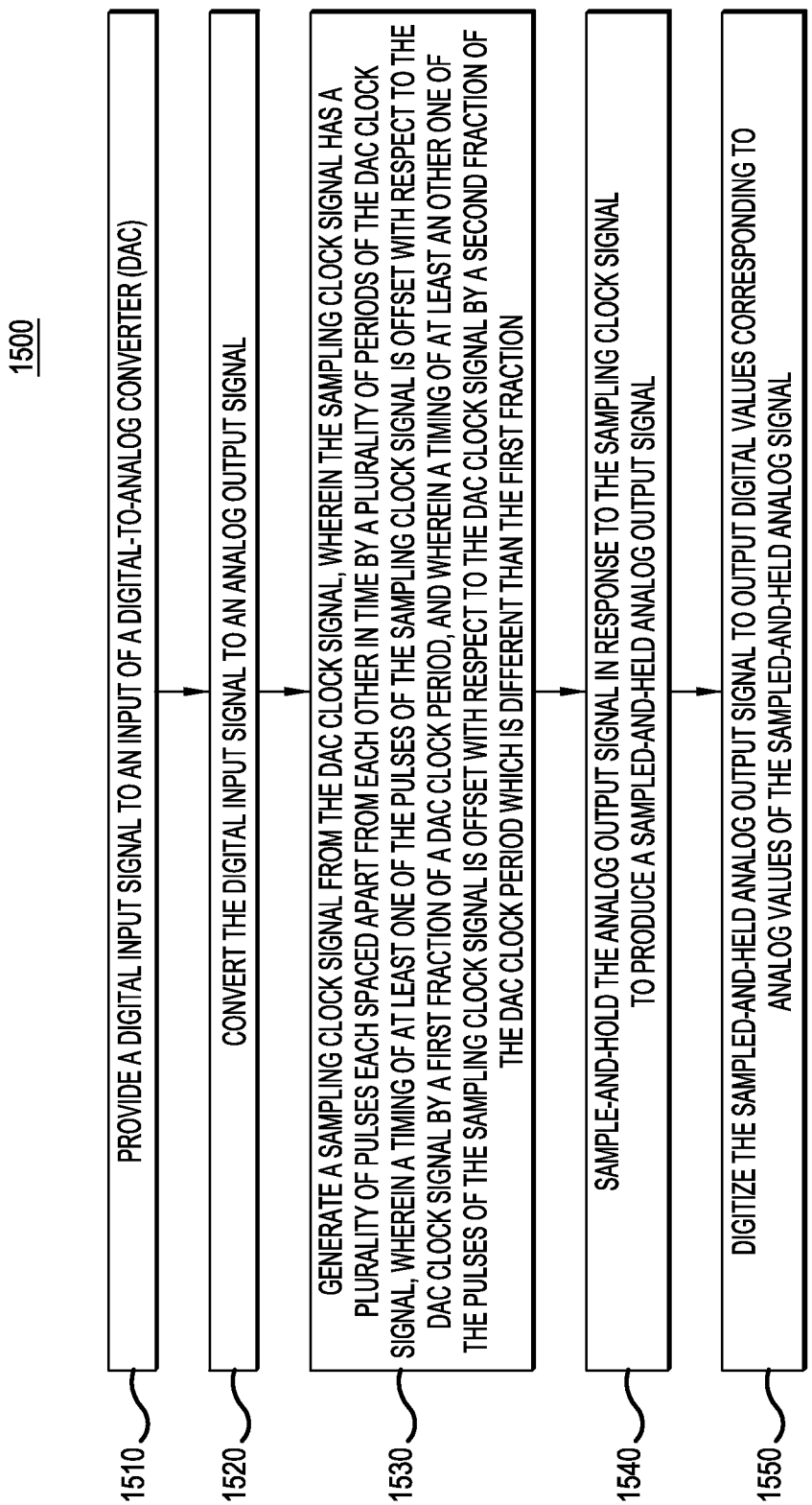
FIG. 15 illustrates an example embodiment of a method of sampling an output signal of a DAC.

FIG. 15 illustrates an example embodiment of a method 1500 of sampling an output signal of a DAC, as described above.

An operation 1510 includes providing a digital input signal to an input of a digital-to-analog converter (DAC) and, in response to a DAC clock signal An operation 1520 includes converting the digital input signal to an analog output signal.

An operation 1530 includes generating a sampling clock signal from the DAC clock signal. Here, the sampling clock signal has a plurality of pulses each spaced apart from each other in time by a plurality of periods of the DAC clock signal. The timing of at least one of the pulses of the sampling clock signal is offset with respect to the DAC clock signal by a first fraction of a DAC clock period, and the timing of at least an other one of the pulses of the sampling clock signal is offset with respect to the DAC clock signal by a second fraction of the DAC clock period which is different than the first fraction.

An operation 1540 includes sampling-and-holding the analog output signal in response to the sampling clock signal to produce a sampled-and-held analog output signal.

An operation 1550 includes digitizing the sampled-and-held analog output signal to output digital values corresponding to analog values of the sampled-and-held analog output signal.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method, comprising:
providing a digital input signal to an input of a digital-to-analog converter (DAC) and, in response to a DAC clock signal, the DAC converting the digital input signal to an analog output signal;
generating a sampling clock signal from the DAC clock signal, wherein the sampling clock signal has a plurality of pulses each spaced apart from each other in time by a plurality of periods of the DAC clock signal, wherein a timing of at least one of the pulses of the sampling clock signal is offset with respect to the DAC clock signal by a first fraction of a DAC clock period, and wherein a timing of at least an other one of the pulses of the sampling clock signal is offset with respect to the DAC clock signal by a second fraction of the DAC clock period which is different than the first fraction;
sampling-and-holding the analog output signal in response to the sampling clock signal to produce a sampled-and-held analog output signal; and
digitizing the sampled-and-held analog output signal to output digital values corresponding to analog values of the sampled-and-held analog output signal.

2. The method of claim 1, further comprising varying over time a number of the plurality of periods of the DAC clock signal by which the plurality of pulses of the sampling clock signal are spaced apart from each other in time from one pulse to another pulse.

3. The method of claim 1, wherein generating a sampling clock signal from the DAC clock signal comprises dividing a frequency of the DAC clock signal by a value N>1 to produce a divided DAC clock signal.

4. The method of claim 3, further comprising varying a number of the plurality of periods of the DAC clock signal by which the plurality of pulses of the sampling clock signal are spaced apart from each other in time from one pulse to another pulse by varying the value N over time.

5. The method of claim 3, further comprising varying a phase of the sampling clock signal over time in coarse steps as multiples of the DAC clock period, and in fine steps as fractions of the DAC clock period.

6. The method of claim 5, further including varying a number of the plurality of periods of the DAC clock signal by which a pulse of the sampling clock signal is delayed with respect to the analog output signal of the DAC,
wherein dividing the frequency of the DAC clock signal by a value $N_{DIV}$>1 comprises applying the DAC clock signal to a counter and outputting a counter output signal, and
wherein varying the number of the plurality of periods of the DAC clock signal by which the pulse of the sampling clock signal is delayed with respect to the analog output signal of the DAC includes comparing the counter output signal to a coarse timing setpoint to output the divided DAC clock signal.

7. The method of claim 5, further including varying a number of the plurality of periods of the DAC clock signal by which a pulse of the sampling clock signal is delayed with respect to the analog output signal of the DAC,
wherein dividing the frequency of the DAC clock signal by a value $N_{DIV}$>1 comprises applying the DAC clock signal to a counter, and
wherein varying the number of the plurality of periods of the DAC clock signal by which the pulse of the sampling clock signal is delayed with respect to the analog output signal of the DAC includes changing a value of $N_{DIV}$ to have a larger or smaller value.

8. The method of claim 5, wherein varying the phase of the sampling clock signal over time includes producing with a delay line a plurality of candidate sampling clock signals each having a different phase with respect to each other, and over time selecting different ones of the candidate sampling clock signals to be the sampling clock signal.

9. The method of claim 1, wherein the digital signal is a periodic signal having a period at least two times greater than a period of the DAC clock signal.

10. The method of claim 1, wherein the digital signal is one selected from a group consisting of: a periodic pseudorandom bitstream, a digital chirp signal, and a multi-tone signal.

11. The method of claim 1, wherein the plurality of pulses of the sampling clock signal are all spaced apart from each other in time by at least two periods of the DAC clock signal.

12. The method of claim 1, wherein generating the sampling clock signal from the DAC clock signal includes adjusting the timing of a plurality of the pulses of the sampling clock signal to be offset with respect to the DAC clock signal by at least two different fractions of the DAC clock period, including at least a first fraction less than or equal to ½ of the DAC clock period; and a second fraction greater than or equal to ½ of the DAC clock period.

13. The method of claim 1, further comprising processing the digital values to obtain an indication of a nonlinear distortion produced by the DAC.

14. The method of claim 13, wherein processing the digital values output by the digitizer to obtain an indication of a nonlinear distortion produced by the DAC includes comparing the digital values to the digital input signal, and wherein the method further comprises obtaining calibration data for calibrating the DAC to at least partially compensate for the nonlinear distortion.

15. The method of claim 1, further comprising processing the digital values output by the digitizer to measure a frequency response of the DAC.

16. A device, comprising:
a digital-to-analog converter (DAC) having an input configured to receive a digital input signal and an output configured to output an analog output signal in response to a DAC clock signal;
a sample-and-hold circuit connected to the output of the DAC and configured to sample and hold the analog output signal in response to a sampling clock signal to output a sampled-and-held analog output signal;
a digitizer connected to an output of the sample-and-hold circuit to receive the sampled-and-held analog output signal and in response thereto to output digital values corresponding to the sampled-and-held analog output signal; and
a sampling clock signal generator connected to receive the DAC clock signal and in response thereto to generate the sampling clock signal,
wherein the sampling clock signal has a plurality of pulses each spaced apart from each other in time by a plurality of periods of the DAC clock signal, wherein a timing of at least one of the pulses of the sampling clock signal is offset with respect to the DAC clock signal by a first fraction of a DAC clock period, and wherein a timing of at least an other one of the pulses of the sampling clock signal is offset with respect to the DAC clock signal by a second fraction of the DAC clock period which is different than the first fraction.

17. The device of claim 16, wherein the sampling clock signal generator comprises:
a coarse time-base generator configured to divide a frequency of the DAC clock signal and to provide a divided DAC clock signal; and
a fine delay adjuster configured to output the sampling clock signal by applying a selectable delay to the divided DAC clock signal, wherein the selectable delay includes fractions of a clock period of the DAC clock signal.

18. The device of claim 17, wherein a phase of the coarse time-base generator is phase adjustable in steps of a period of the DAC clock period.

19. The device of claim 17, wherein the coarse time-base generator comprises a counter.

20. The device of claim 19, wherein the counter is configured to divide a frequency of the DAC clock signal by a value $N_{DIV} > 1$ and output a counter output signal, and wherein the coarse time-base generator further includes a comparator having a first input connected to receive the counter output signal and a second input connected to receive a variable coarse timing setpoint, and wherein the comparator is configured to vary a number of the plurality of periods of the DAC clock signal by which the plurality of pulses of the sampling clock signal are delayed with respect to the analog output signal of the DAC over time by comparing the counter output signal to the variable coarse timing setpoint to output the divided DAC clock signal.

21. The device of claim 19, wherein the counter is configured to divide a frequency of the DAC clock signal by a value $N_{DIV} > 1$ to output a divider output signal, and is further configured to vary the number of the plurality of periods of the DAC clock signal by which the plurality of pulses of the sampling clock signal are delayed with respect to the analog output signal of the DAC from one pulse to another pulse over time by changing a value of N to have a larger or smaller value.

22. The device of claim 16, further comprising a processor connected to an output of the digitizer and configured to process the digital values output by the digitizer to obtain an indication of a nonlinear distortion produced by the DAC includes comparing the digital values to the digital input signal, and wherein the method further comprises obtaining calibration data for calibrating the DAC to at least partially compensate for the nonlinear distortion.

* * * * *